PRODUCTION OF HIGH TEMPERATURE ALLOYED SEMICONDUCTORS

Filed Jan. 4, 1957

INVENTOR

Robert E. Anderson

BY Stevens, Davis, Miller & Mosher

ATTORNEYS

United States Patent Office 2,985,550

Patented May 23, 1961

2,985,550

PRODUCTION OF HIGH TEMPERATURE ALLOYED SEMICONDUCTORS

Robert E. Anderson, Richardson, Tex., assignor to Texas Instruments Incorporated, Dallas, Tex., a corporation of Delaware Filed Jan. 4, 1957, Ser. No. 632,559

5 Claims. (Cl. 148—1.5)

This invention relates to semiconductor devices and more specifically to diodes and transistors which are especially adapted for an increased temperature range of operability.

It is well known that the use of semiconductor devices such as diodes and transistors is limited as regards the temperature at which the devices are operated. There is an upper temperature limit for each kind of semiconductor device depending upon several appreciated factors. It is well recognized that atomic particle activity is related to thermal environmental conditions. Hence, as temperature increases, particle activity also increases. Where there is a junction defined in a semiconductor device, a temperature is ultimately reached that causes particle activity to become sufficiently intense to bring about a breakdown of the junction. At this time, the semiconductor device becomes useless as a diode or transistor since its junctions no longer function in a unidirectional capacity.

Of the available semiconductor materials, silicon and germanium are the most widely used. Accordingly, the present description, although made with respect to these two materials, will emphasize more particularly silicon. Silicon is known to be capable of transistor action, i.e. still functions as a semiconductor, up to about 300° C. There is a serious problem, however, in producing alloy transistors, or diodes for that matter, capable of operating at junction temperatures much in excess of 150° C. which occur at ambient temperatures of approximately 100° C. This problem mainly exists by virtue of the materials which can be most successfully used for the alloy dots, notably among which are indium and indium-gallium alloy. Both of these materials become mushy or molten at about 150° C. This fact places an upper limitation upon the operational temperature for units including these materials in the allow dots. Whereas other materials useful for dots, such as aluminum, are capable of withstanding much higher temperatures without becoming molten, they are subject to an ancillary difficulty, namely, one of cracking out of the silicon when subjected to a reasonably wide range of temperature variation. As is perfectly obvious, this difficulty stems almost entirely from the great differences between the coefficients of thermal expansion for the aluminum and the silicon.

Prior attempts to overcome the problems enumerated in the previous paragraph have been devoted almost exclusively to finding an alloy having a reasonably high melting point, good doping properties and little or no tendency to crack out when the unit is subjected to a wide range of temperatures. Needless to say, the attempts to harmonize these seemingly inconsistent properties have not borne fruits of any real value. In place of pursuing this line of thinking, the present invention sought and succeeded in finding a solution to this troublesome problem by an entirely different route. Notwithstanding offered solutions to substitute a different material, the fact remains that indium alloys very well to silicon and only suffers one disadvantage, that of not being able to withstand temperatures in excess of 150° C. In an effort to increase the softening or melting point of indium, various materials were alloyed with it. Although the temperature problem was to a large extent solved by this technique, other problems of an equally serious nature were encountered which rendered all such alloys of little or no value.

There was finally evolved, however, by means of extensive and perservering research, a method that solved the temperature problem described above without introducing new equally serious problems, the practice of which resulted in an article having a desirably increased temperature range of operability.

The method evolved which constitutes the present invention consists of alloying an indium dot to one face of a semiconductor element, such as a wafer, in order to obtain the fullest advantage of the desirable doping properties of the indium, and thereafter alloying or fusing lead into that portion of the indium dot not alloyed to the semiconductor material. It was discovered that upon using this technique for fabrication, the lead raises the melting point of that portion of the indium dot not alloyed with the semiconductor material, i.e. that proportion to which the electrical leads are connected, but it does not alloy with the indium in the region of the wafer doped thereby. Thus, the technique offered by the present advantage leaves undisturbed the desired characteristics of the unit achieved by indium doping and also imparts to the dot an increased ability to withstand high temperatures. Surprisingly enough, it was also discovered that an indium-lead alloy can be alloyed with the silicon. When this was done, however, it was found that the indium-lead alloy was deficient in at least one important respect. The presence of the lead throughout the medium so reduced the doping properties of the indium that it was impossible to make satisfactory units using the indium-lead alloy.

It is therefore a principal object of the present invention to provide semiconductor devices of the alloyed junction type in which the alloyed material had been specially characterized to possess a relatively high melting point, whereby the device is able to operate over an increased temperature range.

It is a further object of the present invention to provide an alloyed junction diode which is capable of being efficiently operated at ambient temperatures up to 150° C. and a method for making same.

It is a further object of the present invention to provide an alloyed junction transistor for handling large amounts of power at ambient temperatures up to 150° C. and a method for making same.

In accordance with these objects, an alloyed junction diode is specifically described comprised of a wafer of n-type semiconductive material, such as silicon, containing an appropriate impurity, onto which a p-type impurity material comprising an indium alloy is alloyed at a temperature of 1100° C. to form a p-n junction. Lead is then added to the indium alloy material at a temperature of 600° C. so that the lead diffuses into the indium alloy material and raises its melting point. A tab of gold and platinum is then alloyed at a temperature of 800° C. to the wafer on the side opposite to where the p-n junction was made to provide on ohmic contact to the n-type material.

Similarly, a high power alloyed junction transistor is specifically described in which a wafer of n-type semiconductive material, such as silicon, containing an n-type impurity, serves as the base of the transistor. A dot of a p-type impurity material comprising an indium alloy is alloyed to one side of the wafer and serves as the emitter. A second dot of an indium alloy material is alloyed to the opposite side of the wafer and serves as the collector. The emitter and collector dots are alloyed to the wafer at a temperature of 1100° C. to form p-n junctions with the base. After these junctions have been made, lead is alloyed into the indium alloy materials, composing the emitter and collector dots, at a temperature of 600° C. The lead diffuses into the indium alloy and raises its melting point. A rectangular annular tab of gold and platinum is alloyed to the wafer at a temperature of 800° C. in order to provide an ohmic contact to the base of the transistor.

Further details and advantages of the unique method for increasing the temperature range of operability of the high power semiconductor devices provided by this invention will be apparent from a consideration of the following description of a preferred embodiment of a transistor and a preferred embodiment of a diode when taken in conjunction with the appended drawings. It is to be understood, however, that many modifications and changes in detail may be made within the scope of this invention and that the specific embodiments given hereinafter are simply for the purpose of illustration, not limitation. For example, other n-type semi-conductive materials, such as germanium, may be used without departing from the principles of the present invention.

Figure 1:
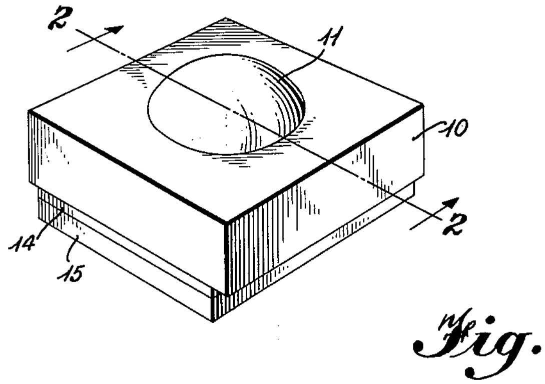
Figure 1 is a perspective view of an alloyed junction diode.
Figure 2:
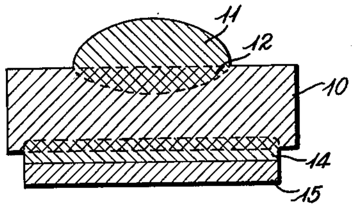
Figure 2 is a sectional view taken along line 2—2 of Figure 1.
Figure 3:
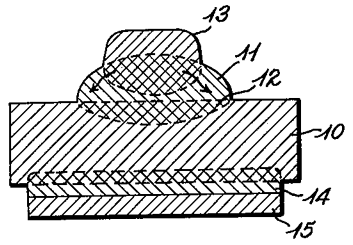
Figure 3 is a sectional view similar to Figure 2 but showing the addition of lead as a part of the process for manufacturing the diode.

Referring now to the drawings, and more specifically to Figures 1, 2 and 3, the high current diode provided by the present invention comprises a wafer 10 of semiconductive material, preferably silicon, to which a dot 11 of an indium alloy material is alloyed at a temperature of about 1100° C. so that some of the indium alloy material actually diffuses or alloys into a portion of the wafer 10 to form a p-n junction at 12, since indium is a p-type impurity material. The indium alloy is preferably composed of 99% indium and 1% gallium. The size of the dot 11 may vary in order to provide diodes which allow various amounts of current in the forward direction. As is shown in Figure 3, after the p-n junction 12 has been made, a piece of lead 13 is alloyed to the dot 11 of the indium alloy, at a temperature hot enough to cause the lead to diffuse into the indium alloy dot 11. A sufficient temperature has been found to be 600° C. The lead raises the melting point of the indium alloy to a temperature of between 200° C. and 300° C. This enables the working ambient temperature of the diode to become as high as 150° C. without fear of failure. The finished diode assumes a form similar to that shown in Figures 1 and 2. The piece of lead 13, shown in Figure 3, ultimately alloys or blends with the dot 11 and the whole assumes a hemispherical shape.

A contact to the n-side of the p-n junction is provided by a tab, or element which is alloyed to the side of the silicon wafer 10 opposite that to which the dot 11 is alloyed. The tab comprises a layer 14 of gold which is about .001 inch thick and a layer 15 of platinum which is .002 inch thick. The gold layer 14 is adjacent the wafer 10 and fuses slightly into the silicon wafer 10 during the alloying operation, while the platinum layer 15 is on the outside.

Figure 4:
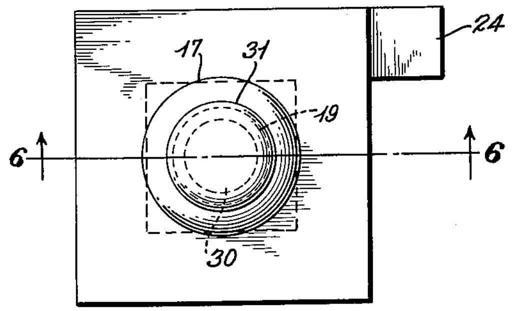
Fig. 4 is a top plan view of an alloyed junction transistor provided in accordance with the present invention, in which lead is shown diffused into the emitter and collector dots as a part of the process for manufacturing the transistor.
Figure 6:
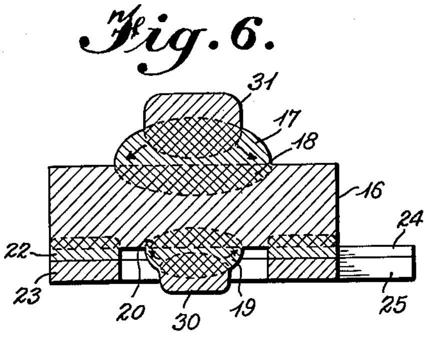
Figure 6 is a sectional view taken along line 6—6 of Figure 4.
Figure 5:
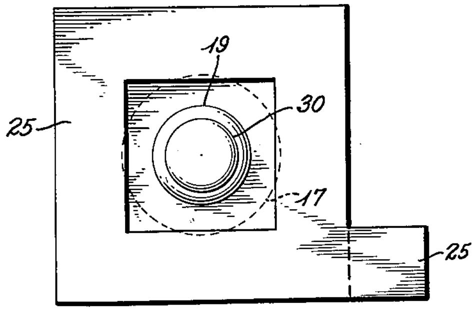
Figure 5 is a bottom plan view of the transistor shown in Figure 4.

An alloyed junction transistor provided in accordance with the present invention is shown in Figures 4, 5 and 6. A wafer 16 of n-type semiconductive material, preferably silicon, containing an n-type impurity, serves as the base of the transistor. An emitter dot 19 which is preferably composed of an alloy of 99% indium, 1% gallium, and approximately .1% boron is alloyed to one side of the silicon wafer 16 so that the indium alloy material diffuses into the wafer 16 to form the emitter to base p-n junction at 20. A collector dot 17 which is larger than the emitter dot 19 and which is preferably composed of an alloy of 99.75% indium, and .025% gallium is alloyed to the opposite side of the wafer 16 so that this alloy material diffuses into the wafer adjacent the collector dot and forms a collector to base p-n junction at 18. Pieces of lead 30 and 31 are then alloyed into the emitter dot 19 and collector dot 17 respectively at a temperature sufficient to cause diffusion or alloying of the lead throughout the emitter and collector dots 17 and 19. This brings the melting point of the indium alloy up to a temperature of between 200° C. and 300° C. A diffusion temperature of about 600° C. has been found desirable. These higher melting temperatures for the emitter and collector dots enable the transistor to be safely operated at ambient temperatures up to 150° C. In the completed transistor, the lead pieces 30 and 31 are diffused completely into the emitter and collector dots 19 and 17 and the dots retain their hemispherical shape. The lead, however, does not diffuse to any substantial extent into the previously alloyed regions 18 and 20 and thus does not offset in any way the good doping properties of the indium alloy.

An ohmic base contact for the transistor comprises a rectangular annular tab or element, having a layer of gold 22 which is .001 inch thick and a layer of platinum which is .002 inch thick. The gold and platinum are welded together and then alloyed to the wafer 16 on the side to which the emitter dot 19 is alloyed so that the tab surrounds but does not touch the emitter dot 19. The gold layer 22 is adjacent the wafer 16 and fuses slightly into the silicon wafer 16, and the platinum layer 23 is on the outside. Extended tab portions 24 and 25 of the layers 22 and 23 project laterally from one side of the wafer 16 to afford an element to which a base lead may be readily connected.

In the manufacture of the high current alloyed junction diode, the n-type silicon wafer 10 is grown on a 1, 1, 1 plane, after which the dot 11 of the p-type alloy composed of 99% indium and 1% gallium is alloyed to the wafer 10 at a temperature of 1100° C., and this temperature is held for a period of two minutes so that the p-n junction 12 may be properly formed. Next, as shown in Figure 3, a piece of lead 13 is placed against the dot of the indium alloy 11 and is heated to a temperature of around 600° C. so that the lead diffuses into the indium alloy dot 11 in order to raise its melting point to between 200° C. and 300° C. The tab layers 14 and 15 of gold and platinum are then alloyed at a temperature of 800° C. to the side of the wafer 10 opposite that to which the p-type impurity dot 11 was alloyed to provide an ohmic contact to the n-side of the diode.

In the manufacture of the alloyed junction transistor the n-type silicon wafer 16 is grown on a 1, 1, 1 plane, and a p-type emitter dot 19, which is composed of an alloy of 99% indium, 1% gallium, and approximately .1% boron, is alloyed to one side of the wafer 16, at a temperature of 1100° C. so that the indium alloy material diffuses into the wafer 16 to form the emitter to base p-n junction 20. At the same time the collector dot 17, composed of 99.75% indium and .25% gallium is alloyed to the opposite side of the wafer 16 at a temperature of around 1100° C. so that this alloy material diffuses into the wafer adjacent the collector dot and forms the collector to base p-n junction 18.

Pieces of lead 30 and 31 are then placed against the emitter dot 19 and collector dot 17 and are heated to a temperature of 600° C. to melt the lead and cause it to diffuse throughout the emitter dot 19 and collector dot 17 in order to bring their melting points up to between 200° C. and 300° C. These higher melting temperatures for the emitter dot 19 and collector dot 17 enable the transistor to be safely operated at ambient temperatures up to 150° C.

The ohmic base contact tab comprising the gold layer 22 and the platinum layer 23 is then alloyed at a temperature of 800° C. to the wafer 16 on the side to which the emitter dot 19 is alloyed in order to provide a contact to the base region 16.

The elevation of the maximum working ambient temperature of the transistor and the diode up to 150° C. allows more power to be dissipated in this semiconductor device in the form of heat, and in general allows a greater temperature range of operability.

Although this invention has been shown and described with reference to specific embodiments, numerous modifications and changes obvious to those skilled in the art which would not depart from the spirit of the inventive concepts disclosed herein, are deemed to be within the spirit, scope, and contemplation of the invention.

What is claimed is:

1. A method for making a semiconductor device comprising the steps of alloying a first portion of a dot comprised of indium with a wafer of n-type silicon to form a p-n junction and alloying lead into and throughout the remaining portion of said dot exclusive of said first portion to raise the melting point of the remaining portion of said dot.

2. A method for making a semiconductor device comprising the steps of alloying a first portion of a dot comprised of indium with a wafer of n-type silicon at a temperature of 1100° C. to form a p-n junction and alloying lead into and throughout the remaining portion of said dot exclusive of said first portion at a temperature of 600° C. to raise the melting point of the remaining point of said dot.

3. A method for making a semiconductor diode comprising the steps of alloying a first portion of a dot comprised of an alloy containing approximately 99% indium and 1% gallium to one face of a wafer of n-type silicon at a temperature of 1100° C. to form a p-n junction, alloying lead into and throughout the remaining portion of said dot exclusive of said first portion at a temperature of 600° C. to raise the melting point of the remaining portion of said dot, and alloying gold at a temperature of 800° C. to the face of said wafer opposite that to which said dot is alloyed.

4. A method for making a transistor device comprising the steps of alloying a first portion of an emitter dot comprised of an indium alloy to one face of a wafer of n-type silicon to form a p-n junction, said wafer serving as the base of said transistor device, alloying a first portion of a collector dot comprising an indium alloy to the face of said wafer opposite that to which said emitter dot is alloyed to form a second p-n junction, and alloying lead into and throughout the remaining portions of said emitter and collector dots exclusive of said first portions to raise the melting points of the remaining portions of said emitter and collector dots.

5. A method for making a transistor device comprising the steps of alloying a first portion of an emitter dot comprised of an alloy containing approximately 99% indium, 1% gallium, and .1% boron to one face of a wafer of n-type silicon at a temperature of 1100° C. to form a p-n junction, said wafer serving as the base of said transistor device, alloying a first portion of a collector dot comprised of an alloy containing approximately 99.75% indium and .25% gallium at a temperature of 1100° C. into the face of said wafer opposite that to which said emitter dot is alloyed to form a second p-n junction, and alloying lead into and throughout the remaining portions of said emitter and collector dots exclusive of said first portions at a temperature of 600° C. to raise the melting points of the remaining portions of said emitter and collector dots.

References Cited in the file of this patent

UNITED STATES PATENTS

| | | |
|---|---|---|
| 2,644,852 | Dunlap | July 7, 1953 |
| 2,689,930 | Hall | Sept. 21, 1954 |
| 2,721,965 | Hall | Oct. 25, 1955 |
| 2,736,847 | Barnes et al. | Feb. 28, 1956 |
| 2,757,324 | Pearson | July 31, 1956 |
| 2,778,980 | Hall | Jan. 22, 1957 |
| 2,806,807 | Armstrong | Sept. 17, 1957 |
| 2,815,303 | Smith | Dec. 3, 1957 |
| 2,814,304 | Gudmundsen | Dec. 3, 1957 |
| 2,817,613 | Mueller | Dec. 24, 1957 |
| 2,820,135 | Yamakawa | Jan. 14, 1958 |
| 2,831,787 | Emeis | Apr. 22, 1958 |
| 2,836,522 | Mueller | May 27, 1958 |
| 2,837,704 | Emeis | June 3, 1958 |
| 2,853,661 | Houle et al. | Sept. 23, 1958 |
| 2,862,840 | Kordalewski | Dec. 2, 1958 |
| 2,868,683 | Jochems et al. | Jan. 13, 1959 |
| 2,887,417 | Blanks | May 19, 1959 |